United States Patent [19]
Shimoyama et al.

[11] Patent Number: 5,372,837
[45] Date of Patent: Dec. 13, 1994

[54] METHOD OF MANUFACTURING THIN FILM EL DEVICE UTILIZING A SHUTTER

[75] Inventors: Hiroyuki Shimoyama; Noriaki Nakamura, both of Nara; Kinichi Isaka, Yamatokoriyama; Akio Inohara, Osaka; Hiroshi Kishishita, Nara, all of Japan

[73] Assignee: Sharp Kabushiki Kaisha, Osaka, Japan

[21] Appl. No.: 79,847

[22] Filed: Jun. 22, 1993

Related U.S. Application Data

[63] Continuation of Ser. No. 707,910, May 30, 1991, abandoned.

[30] Foreign Application Priority Data

May 30, 1990 [JP] Japan .................. 2-140629

[51] Int. Cl.$^5$ ............................................ B05D 5/12
[52] U.S. Cl. ............................................. 427/8; 427/9; 427/10; 427/64; 427/126.2; 427/255.2; 427/566; 427/585
[58] Field of Search ............... 427/8, 9, 10, 64, 126.2, 427/255.2, 566, 585; 73/579

[56] References Cited

U.S. PATENT DOCUMENTS

| | | | |
|---|---|---|---|
| 3,063,867 | 11/1962 | Emery, Jr. ............................ | 427/10 |
| 3,847,114 | 11/1974 | Kiyozumi ............................ | 118/726 |
| 4,539,217 | 9/1985 | Farley ................................... | 427/10 |
| 4,582,431 | 4/1986 | Cole ..................................... | 427/10 |
| 4,631,197 | 12/1986 | DeFreese et al. ................... | 427/10 |
| 5,006,365 | 4/1991 | Nire et al. ............................. | 427/66 |
| 5,025,664 | 6/1991 | Kendrick et al. ................... | 73/579 |
| 5,112,642 | 5/1992 | Wajid .................................... | 427/10 |

FOREIGN PATENT DOCUMENTS 2227957 6/1972 Germany .
62-149864 3/1987 Japan .

*Primary Examiner*—Shrive Beck
*Assistant Examiner*—Benjamin L. Utech

[57] ABSTRACT

A method of manufacturing a thin film electroluminescent (EL) device in which an electron beam is directed to a pellet of a substance containing an additive agent, and the substance is evaporated and deposited on a substrate and a change per unit time of the growing deposit is monitored by a sensor, comprising the steps of (1) controlling energy of the electron beam in accordance with an output of the sensor during a first time interval for adjusting an evaporation rate of the substance to a specified rate, (2) maintaining the controlled energy of the electron beam constant during a second time interval, larger than the first time interval and alternatively repeating steps (1) and (2).

7 Claims, 8 Drawing Sheets

METHOD OF MANUFACTURING THIN FILM EL DEVICE UTILIZING A SHUTTER

This application is a continuation of application Ser. No. 07/707,910 filed May 30, 1991, now abandoned.

BACKGROUND OF THE INVENTION

1. Field of the Invention

The present invention relates to a method of manufacturing a thin film EL device and an apparatus for manufacturing the same, and more particularly, it relates a method of forming a light emitting layer of a thin film EL device and an apparatus for forming the same.

2. Description of the Prior Art

In general, a thin film EL device of three-layer configuration as shown in FIG. 6 is known. This thin film EL device is patterned with a transparent substrate 28 of glass and a plurality of strip-like transparent electrodes 23 of ITO (indium tin oxide) disposed in parallel at intervals on the substrate 28, and a first dielectric film 24 made of oxide, such as $Al_2O_3$, $SiO_2$ or $TiO_2$, or nitride $Si_3N_4$ is formed on it. Further, upon it, a light emitting layer (approximately 0.8 µm in thickness) 25 having a composition of base material of ZnS, ZnSe or the like and a trace quantity of Mn added thereto to serve as the center of light emission and a second dielectric film 26 made of the above-mentioned oxide or nitride are formed in this order. This, is patterned with strip-like back electrodes 27 of Al disposed on it in parallel at intervals in a direction perpendicular to the transparent electrodes 23. In the thin film EL device thus configured, selectively applying voltage to the transparent electrodes 23 and the back electrodes 27 causes the light emitting layer 25 at crossing points of both the electrodes 23 and 27 to emit light so that dots in an arbitrary combination emit light. In this way, a desired dot matrix display can be achieved.

In forming the light emitting layer 25 of the thin film EL device, first an additive agent (active element), such as Mn and the like, serving as centers of light emission is mixed with the base material, such as ZnS and the like, at a specified rate, and the mixture is molded and annealed to make a donor pellet. Then, a substance derived from the donor pellet is deposited on the first dielectric film 24 on the surface of the transparent substrate 28 by electron-beam vapor deposition.

In recent years, large-scale display screens have been increasingly developed, and a method in which a plurality of ("two" in this example) vapor substances 80, 90 are deposited on a large-scale substrate 1 is employed as shown in FIG. 5 in order to manufacture a large-area thin film EL device. Specifically, a vapor deposition apparatus 101 is provided with hearths 12, 15, where donor pellets 11, 14 are placed. Surfaces 11a and 14a of the donor pellet 11, 14 are irradiated by electron beams by electron guns 13, 16, and the substances 80, 90 are obtained by evaporation of the donor pellet 11, 14, which are deposited on the substrate 1. During the vapor deposition, the substances 80, 90 are continuously deposited on crystal oscillators 17, 21 placed close to the hearths 12, 15 for monitoring. The vapor deposition apparatus is arranged that the crystal oscillators (referred to as "crystal pieces" herein after) 17, 21 continuously supply signals indicating respective deposition rates, and in accordance with the signals, a controller 30 controls energy of the electron beams so that the substances 80, 90 make equivalent contributions to the deposition on the substrate 1. In this way, making a balanced speed R at which the vapor substances 80, 90 are generated, a light emitting layer formed on the substrate 1 can be uniform in thickness throughout.

In general, the electron beams are scanned while they irradiate the overall areas of the surfaces 11a and 14a so that the whole surfaces of the donor pellets 11, 14 can be uniformly heated and evaporated (see Japanese Unexamined Patent Publication No. 149864/1987).

In manufacturing such a large-area thin film EL device, it is necessary to precisely check uniformity of a thickness of a light emitting layer formed on the substrate 1. Thus, to limit a period of time for the deposition under equivalent energies of the electron beams is unsatisfactory, but what is essential is to monitor the deposition rate of the deposited substances each time a light emitting layer is formed, using the crystal pieces 17, 21 as stated above. However, if the deposition rate is monitored continuously during the deposition, there arise the problem that the lifetime of each of the crystal pieces 17, 21 is expired when a deposition process is almost completed once or even before, because the resultant light emitting layer is thick, approximately 0.8 µm. It is a very difficult task to replace or regulate the crystal pieces for each operation, and this is the obstacle to be overcome when manufacturing thin film EL devices.

SUMMARY OF THE INVENTION

The present invention provides an apparatus for manufacturing a thin film EL device comprising a vacuum chamber in which a pellet of a substance and a substrate are housed, an electron beam source placed in the chamber for emitting an electron beam to the pellet so that the substance of the pellet is evaporated and deposited on the substrate, a sensor for sampling an evaporation speed of the evaporated substance only for a specified period at a specified cycle, and control means receiving output of the sensor for controlling energy of the electron beam emitted by the electron beam source so that the evaporation speed becomes a specified value.

Furthermore, the present invention is a method of manufacturing a thin film EL device in which an electron beam is directed to a pellet of a substance containing an additive agent, and the substance is deposited while a speed of depositing the substance is monitored by a sensor, comprising the steps of sampling a speed of evaporating the substance for a specified period of time at a specified cycle by the sensor, and controlling energy of the electron beam for the period of sampling in accordance with output of the sensor so that the evaporation speed becomes a specified value.

Preferably, the sensor comprises a crystal oscillating element with crystal on which the substance deprived from the pellet by evaporation is deposited and a shutter held open only for the period of sampling for causing the substance evaporated to be deposited on the crystal, while the crystal oscillating element outputs a signal in accordance with an amount of deposition on the crystal.

There may be more than one pellet and identical number of electron beam sources for the deposition on the substrate.

It is preferable that a deflecting coil is further provided which is moved at a specified cycle in an area irradiated by the electron beam on the surface of the pellet, so that a cycle of sampling is synchronized with the cycle of the movement of the area irradiated by the electron beam.

It is also preferable that alternating field generated by the deflecting coil causes an electron beam to make a scan on the surface of the pellet, and energy of the electron beam per area the electron beam give the pellet is controlled by varying a scanning width.

Additionally, a central value of the alternating field may be varied at a longer cycle than the cycle of the alternating field to irradiate the overall surface of the pellet with the electron beam.

The pellet may be rotated at a longer cycle than the cycle of the alternating field to irradiate the overall surface of the pellet with the electron beam.

The scanning width may be varied as the deposition proceeds so that a concentration distribution of the additive agent in the thicknesswise direction of the deposited film is varied.

DETAILED DESCRIPTION OF THE PREFERRED EMBODIMENT

For method of manufacturing a thin film EL device according to one embodiment of present invention will described in detail a.

Figure 3:
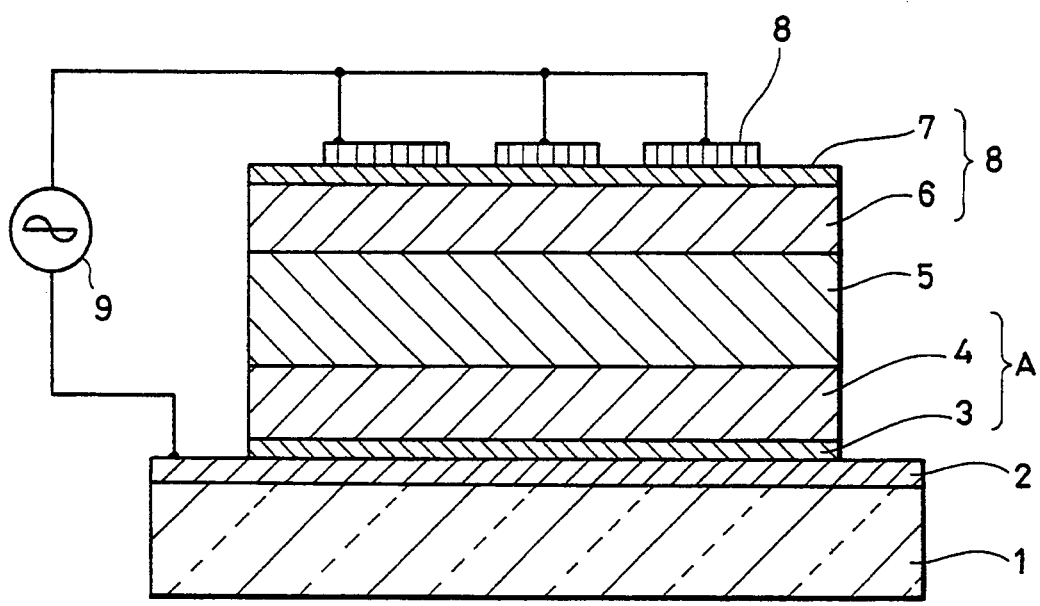
FIG. 3 is a diagram showing a sectional configuration of a thin film EL device to be manufactured.

FIG. 3 shows an example of a cross-section of a large-area thin film EL device manufactured according to the present invention. Reference numeral 1 denotes a glass substrate of thickness 1-3 mm. On the substrate 1, an ITO (indium tin oxide) film of thickness 1000–1800 Å is formed by spattering, and the film is patterned with a plurality of strip-like transparent electrodes 2 which are disposed in parallel with one another. On the transparent electrodes 2, an $SiO_2$ film 3 is deposited in a thickness 200–800 Å by spattering. On the $SiO_2$ film, an Si—N film 4 is deposited in thickness 1000–3000 Å by spattering. The $SiO_2$ film 3 and the Si—N film 4 together make a first dielectric layer A. On the Si—N film 4, a light emitting layer 5 is formed of ZnS:Mn in thickness 6000–8000 Å by electron-beam vapor deposition explained later. Moreover, an Si—N film 6 is deposited in thickness 1000–3000 Å on the light emitting layer 5 by spattering, and an $Al_2O_3$ film 7 is deposited in thickness 200–600 Å on the Si—N film 6 by spattering. The Si—N film 6 and the $Al_2O_3$ film 7 together make a second dielectric layer B. An Al film is formed in thickness 2000–6000 Å on the $Al_2O_3$ by electron-beam vapor deposition, and the Al film is patterned with a plurality of strip-like back electrodes 8 disposed in parallel with one another in a direction perpendicular to the transparent electrodes 2. Alternating drive voltage 9 is applied between the transparent electrodes 2 and the back electrodes 8, and thus, a dot matrix display can be achieved. The surface of the thin film EL device is sealed by seal glass or the like for humidity free condition.

Figure 2:
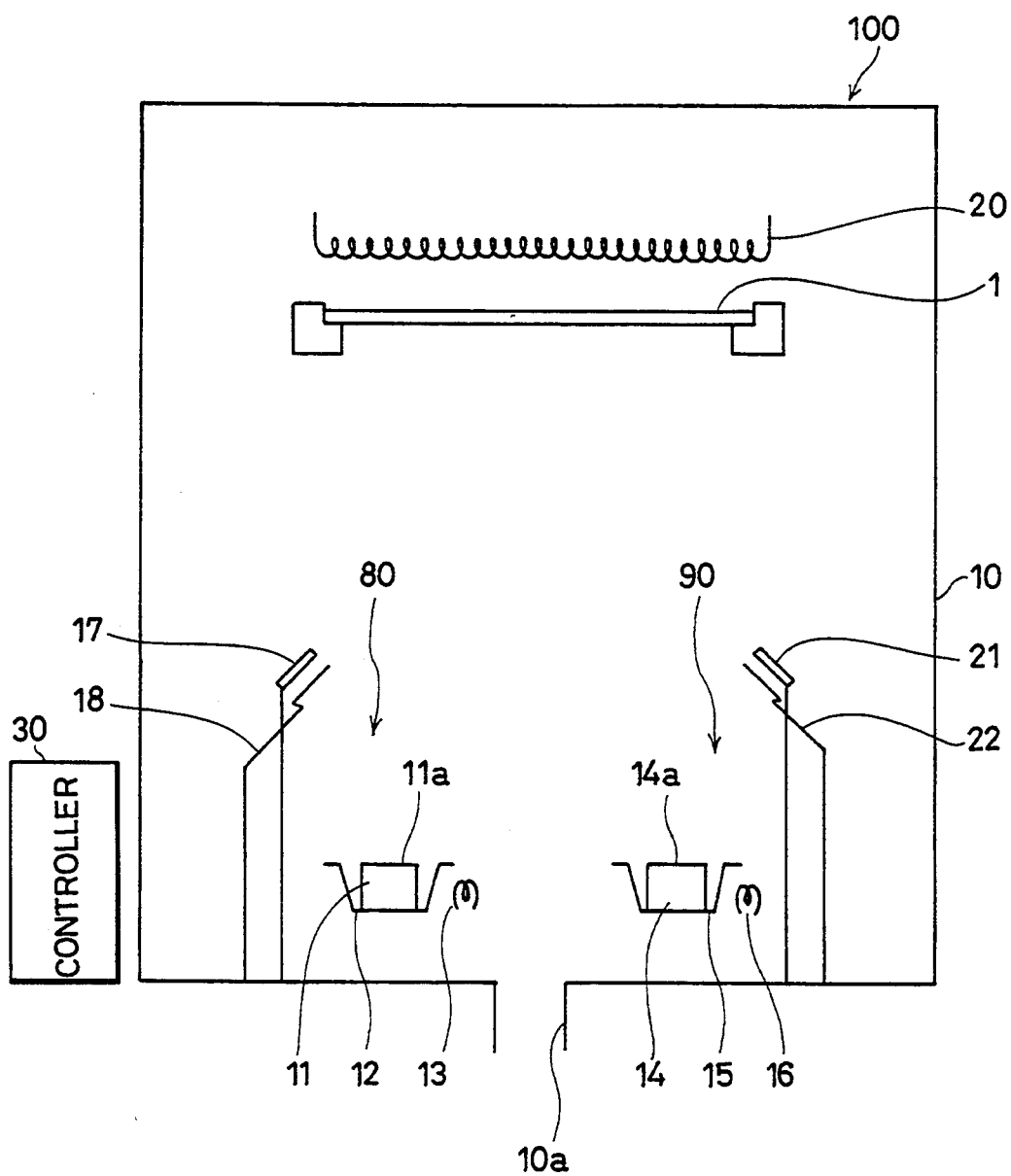
FIG. 2 is a diagram showing a configuration of the vacuum evaporation apparatus.
Figure 5:
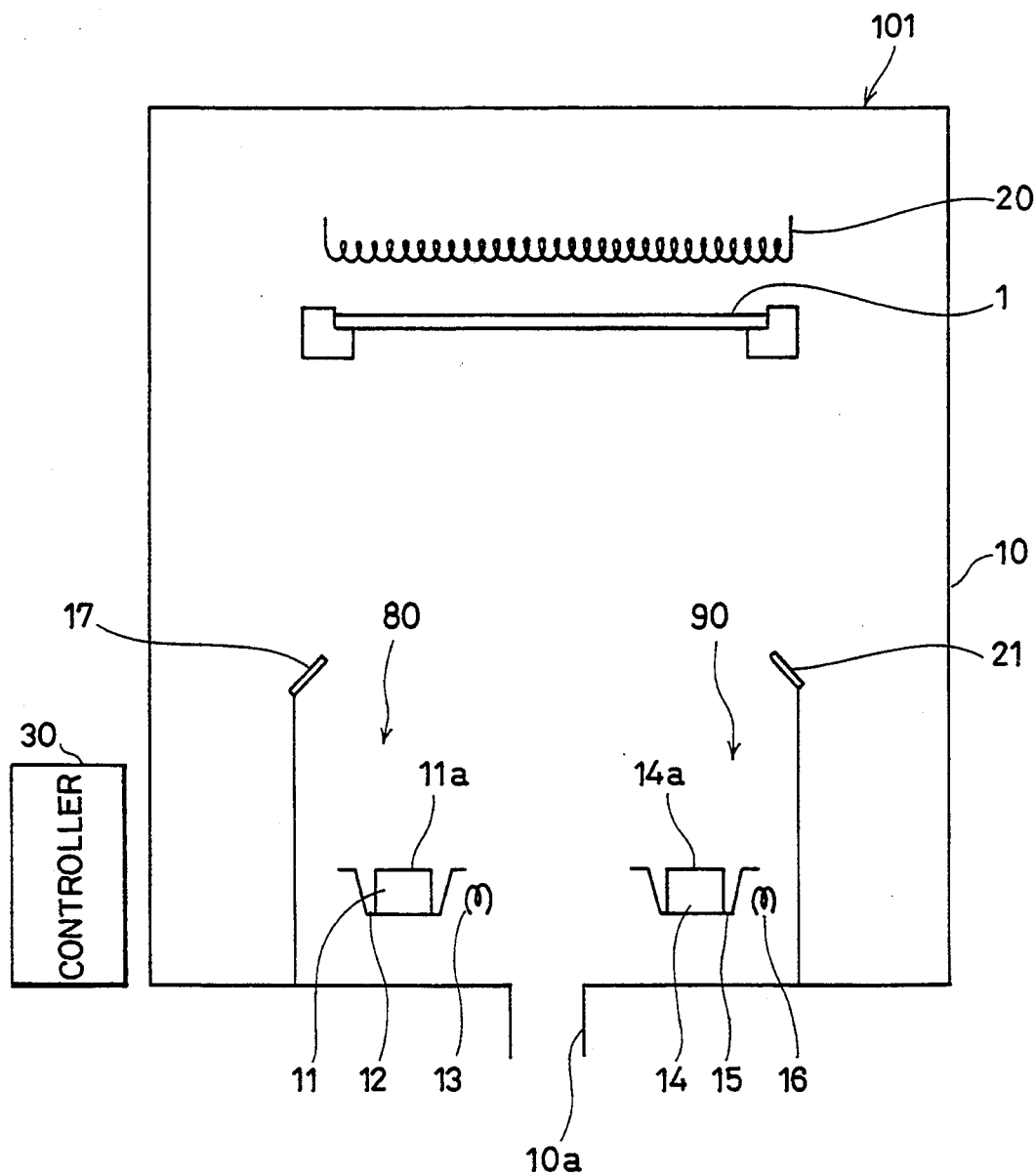
FIG. 5 is a diagram showing a vacuum evaporation apparatus used for manufacturing a thin film EL device in accordance with a prior art manufacturing method.
Figure 6:
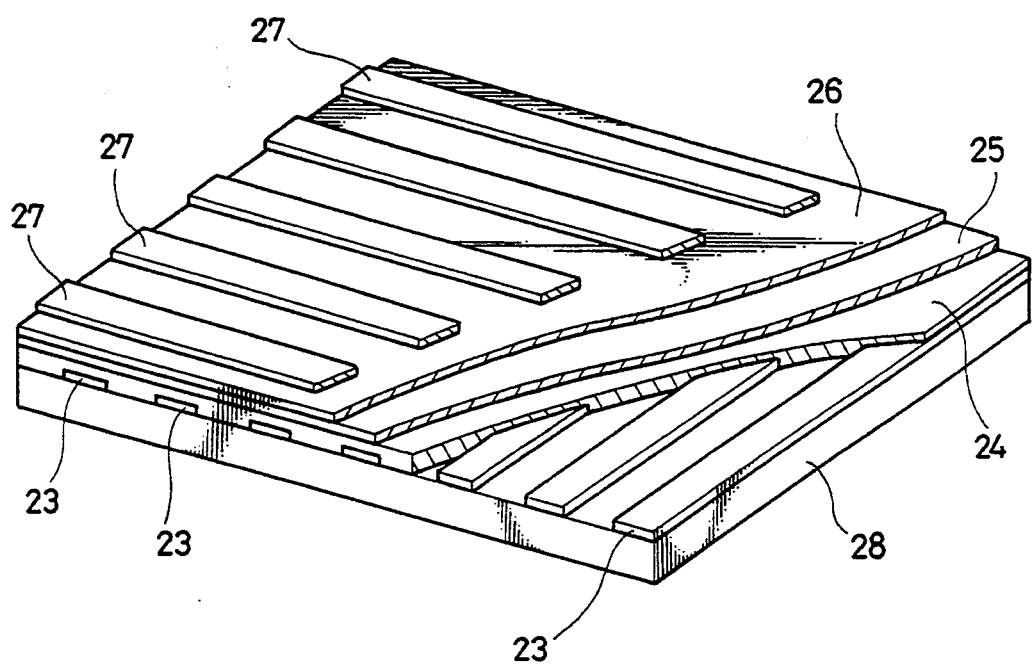
FIG. 6 is a perspective view showing a configuration of a prior art thin film EL device.

The light emitting layer 5 is made using a vacuum evaporation apparatus 100 shown in FIG. 2. Similar to the vacuum evaporation apparatus 101 shown in FIG. 5, the vacuum evaporation apparatus 100 is provided with hearths 12, 15, electron guns 13, 16, crystal oscillating elements (referred to as "crystal pieces" hereinafter) 17, 21 for monitoring, and a controller 30 serving as control means. Furthermore, shutters 18, 22 are provided for covering surfaces of the crystal pieces 17, 21.

In forming the light emitting layer 5, first an activating substance (additive agent) Mn serving as centers of light emission is mixed with the base material of ZnS which is a major component of the light emitting layer 5 at a rate of 0.40–0.50 wt %, and the mixture is molded and annealed to make donor pellets 11, 14. Then, as shown in FIG. 2, the donor pellets 11, 14 are put on the hearths 12, 15 in the vacuum evaporation apparatus 100. Just under a heater 20 of the vacuum evaporation apparatus 100, the glass substrate 1 for supporting the light emitting layer 5 is set. A chamber 10 is set under vacuum condition by discharging air through an exhaust aperture 10a, and the heater 20 keeps the glass substrate at a fixed temperature in a range 200°–280° C. Under these conditions, energy of the electron beam is set almost constant in an output range 500–800 W. A deflecting coil (not shown) generates an alternating field, and surfaces 11a, 14a of the donor pellets 11, 14 are irradiated by an electron beam which is making a scan at the same time. The donor pellets 11, 14 are heated and vaporized to make vapor substances 80, 90. The substances 80, 90 are deposited on the first dielectric layer A on the surface of the glass substrate 1.

Figure 4:
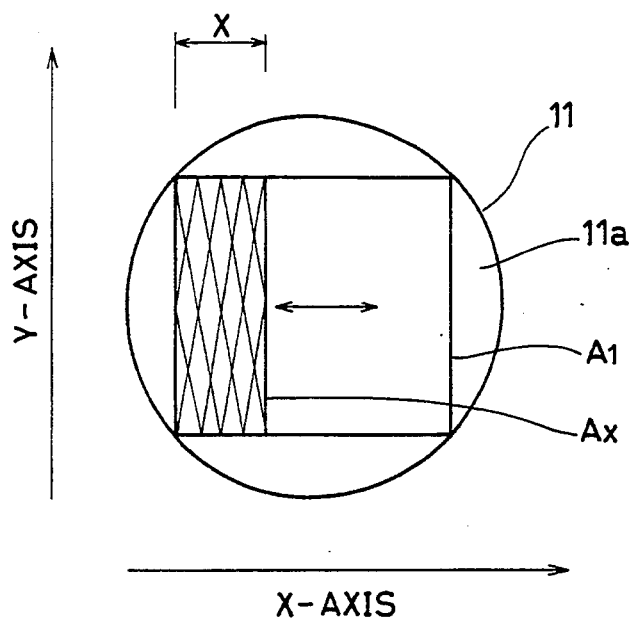
FIG. 4(a) is a diagram showing a state of irradiation of a surface of a donor pellet with an electron beam in accordance with the method of manufacturing a thin film EL device.
FIG. 4(b) is a diagram showing a variation of beam position with time.
Figure 4:
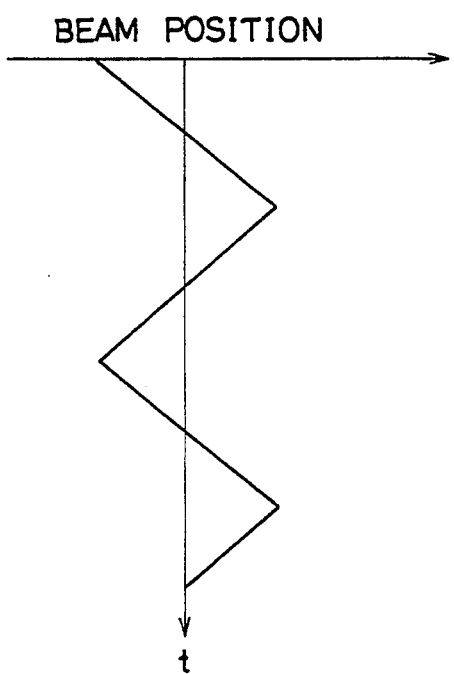
Figure 7:
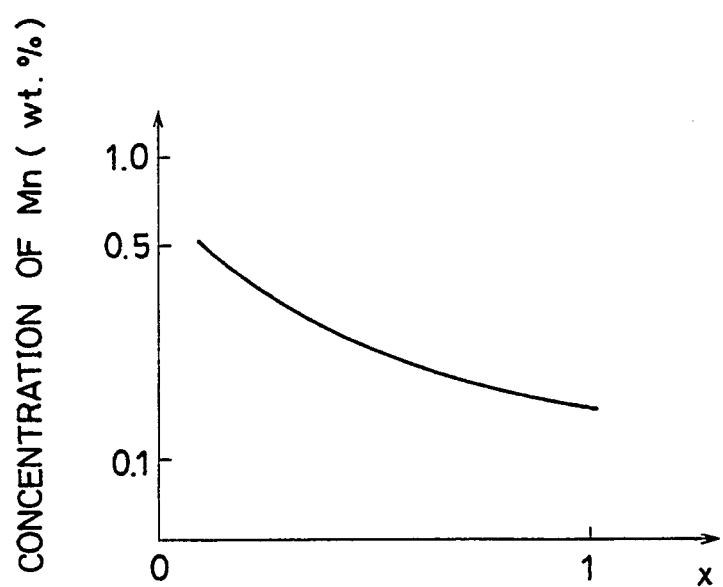
FIG. 7 is a diagram showing the relation of the scanning width of an electron beam With a concentration of Mn in a light emitting layer.

At this time, as shown in FIGS. 4(a) and 4(b), an amplitude of an alternating field applied to the electron beam is narrowed down to set a scanning width x in the X-axis direction, while a central value of the alternating field is varied to irradiate an area Al by slowly vibrating beam position (the center of an area Ax). The relationship between a concentration of Mn in the light emitting layer 5 and the scanning width x is varied in accordance with a temperature dependency of vapor pressures of ZnS and MnS, as shown in FIG. 7. In other words, as the scanning width x is narrowed down, the concentration of Mn rises. In this way, by setting various energy densities per unit area in a region irradiated by an electron beam in the surfaces 11a, 14a of the donor pellets 11, 14, the concentration of Mn in the light emitting layer 5 is varied. Thus, a thin film EL device having various functions, such as gradation function, brightness heightening function, memory function and the like, can be manufactured. Additionally, the whole of the pellets 11, 14 can be effectively used. Scanning frequencies in the X-axis and Y-axis directions are 50 Hz and 500 Hz, respectively, while a frequency of the vibration of the beam position is 1/60 Hz.

Figure 1:
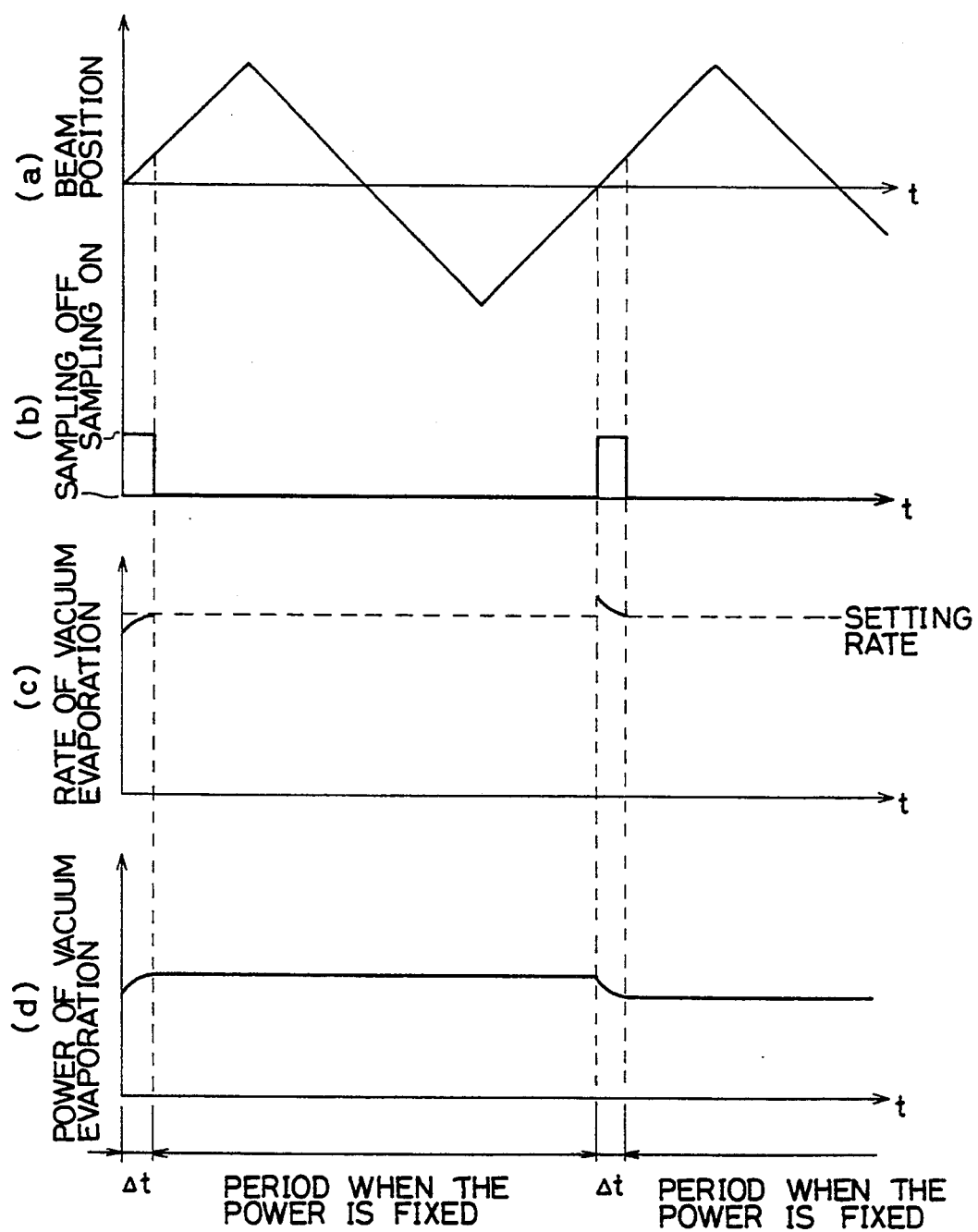
FIG. 1 is a diagram showing a timing at which a vacuum evaporation apparatus operates in a method of manufacturing a thin film EL device of an embodiment according to the present invention.

For a period of the vapor deposition, as shown in FIGS. 1(a) and 1(b), a long cycle of vibrating the beam position is synchronized with a monitor (sampling) period $\Delta t$ set short. For each monitor period $\Delta t$, the shutters 18, 22 are held open, and the controller 30 controls energy of each electron beam in accordance with signals outputted by the crystal pieces 17, 21 so that the vapor substances 80, 90 are generated at an equivalent speed R, as shown in FIG. 1(c). For a period when the power is constant between the monitor periods $\Delta t$, the shutters 18, 22 are held closed, and the energy of each electron beam when the monitor period just before is completed is retained. In this case, the deposition on the surfaces of the crystal pieces 17, 21 are obtained only for the monitor period $\Delta t$ set short. Thus, compared with a case where the deposition is continuously monitored, the lifetime of the crystal pieces 17, 21 can be prolonged; i.e., the crystal pieces 17, 21 may be replaced and regulated less frequently. As shown in FIG. 1(c), the output signals of the crystal pieces 17, 21 cannot be acquired for a period when the power is constant; hence, a deposition rate on the crystal pieces 17, 21 and substrate 1 is gradually deviated from a present value. However, such deviation of the deposition rate can be inhibited at the level where no problem is caused in practical use. When a long cycle of vibrating the beam position is synchronized with a monitor period $\Delta t$ set short, a long cycle of a variation component R (t) of the speed R at which the vapor substances 80, 90 are generated is synchronized with the monitor period $\Delta t$ set short. Thus, there is hardly any variation in the speed R observable on the crystal pieces 17, 21 for the single monitor period $\Delta t$; that is, the variation component R (t) is observed as an almost constant value $R_1$. Moreover, synchronizing the cycle of the variation component R (t) with the monitor period $\Delta t$, an almost identical value $R = R_0 + R_1$ is observed at which the speed R is never periodically varied for each monitor period $\Delta t$. Thus, the deposition rate on the crystal-pieces 17, 21 and the deposition rate on the substrate 1 can come to correspond with each other. Then, the controller 30 can control control energy of the electron beams in accordance with the deposition rate outputted by the crystal pieces 17, 21 so that the vapor substances 80, 90 make an equivalent contribution to the deposition rate on the substrate 1. In this way, the light emitting layer 5 formed on the substrate 1 can be uniform in thickness.

Although there are two kinds of the vapor substances in this embodiment to simplify the description, three or more kinds of them can be employed to attain similar effects.

Both the X-axis and Y-axis positions may be fixed, and self-rotating mechanisms of the hearths 12, 15 holding the donor pellets 11, 14 may be provided so that the donor pellet 11, 14 can rotate by themselves. In this method, also, the donor pellets 11, 14 can be irradiated by the electron beams and evaporated uniformly, and the whole of them can be effectively used.

Furthermore, the scanning width may be varied as the deposition proceeds so that a concentration distribution of Mn in the thicknesswise direction of the light emitting layer 5 is varied. In this way, thin film EL devices having various functions appropriate to uses can be manufactured.

Figure 8:
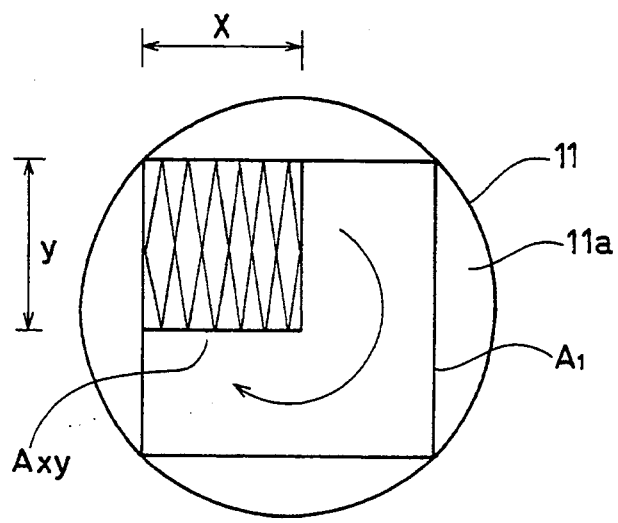
FIG. 8(a) is a diagram showing a state of irradiation of a surface of a donor pellet with an electron beam in accordance with a method of manufacturing a thin film EL device of another embodiment according to the present invention.
FIGS. 8(b) and 8(c) are diagrams showing a variation with time of scanning centers of the electron beam in the X-axis and Y-axis directions.
Figure 8:
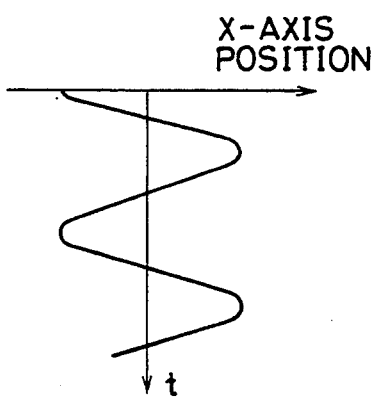
Figure 8:
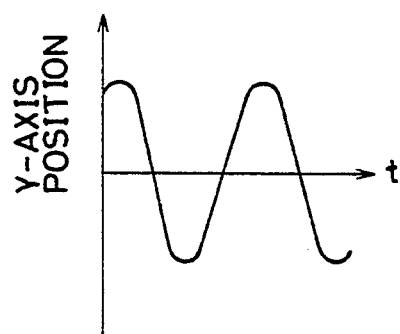

Although the scanning width of the electron beam is narrowed down in one direction (X-axis direction) on the surface of each donor pellet in the previous embodiment, it is not necessary to precisely keep this way but the scanning width may be narrowed down in both the X-axis and Y-axis directions. In this case, as shown in FIG. 8(a), the scanning width is varied in the two directions; it is set as follows: the Y-axis scanning width=y while the X-axis scanning width=x (y=0-1, x=0-1). Then, a value of an area xy of a region Axy is regulated. In this case, similar to the case shown in FIG. 7, as the area xy of the region Axy becomes smaller, the concentration of Mn in the light emitting layer 5 gets higher. Thus, a desired Mn concentration can be attained by regulating the area xy of the region Axy. Moreover, an energy density of an electron beam per unit area can be set larger than that in the method shown in FIG. 4, and a higher Mn concentration can be attained.

In this case, in order to effectively use the whole of the donor pellets 11, 14, as shown in FIGS. 8(b) and 8(c), the X-axis and Y-axis positions may be vibrated at the same cycle with phase difference 90, and the center of scanning may trace circles or ellipses. Also in this case, self-rotating mechanisms are provided in the hearths 12, 15 so that the donor pellets 11, 14 can rotate by themselves.

Furthermore, the scanning widths x and y in the X-axis and Y-axis directions may be varied as the deposition proceeds so that a concentration distribution of Mn in the thicknesswise direction of the light emitting layer 5 is varied. In this way, thin film EL devices having various functions appropriate to uses can be manufactured.

As has been clarified in the previous description, in accordance with the method of manufacturing a thin film EL device and an apparatus for manufacturing the same according to the present invention, under the condition of keeping the energy of the electron beam flowing in the donor pellet per unit period of time constant, a scanning width in one direction or in two directions perpendicular to each other is changed by varying an amplitude of an alternating field generated by the deflecting coil so that an energy density of the electron beam per unit area in a region irradiated by the electron beam on the surface of the donor pellet can be set; therefore, a concentration of centers of light emission in a light emitting layer can be freely controlled.

A central value of the alternating field is varied in a longer cycle than a cycle of the alternating field so that the overall surface of the donor pellet are irradiated by the electron beam; therefore, the whole of the donor pellet can be effectively used.

The donor pellet is rotated in a longer cycle than a cycle of the alternating field so that the overall surface of the donor pellet can be irradiated by the electron beam; therefore, similarly, the whole of the donor pellet can be effectively used.

The scanning width is varied as the deposition proceeds to form a light emitting layer which has a concentration distribution of the additive material in the thicknesswise direction; therefore thin film EL devices having various functions appropriate to uses can be manufactured.

On crystal pieces serving as crystal oscillators for sampling a deposition speed, substances are deposited only for a sampling period; hence, the crystal pieces can be replaced and regulated less frequently.

Moreover, when a long cycle of shifting a region irradiated by an electron beam on the surface of the donor pellet is synchronized with the monitor period set short, a light emitting layer uniform in thickness can be formed without any adverse effect even if a speed at which the vapor substances are generated has some variable component as a result of the shift of the beam position.

What is claimed is:

1. A method of forming an electroluminescent layer in which an electron beam is directed to a pellet of a substance containing an additive agent, and the substance is evaporated and deposited on a substrate and the deposition rate is monitored by a sensor, comprising the steps of:

(1) controlling energy of the electron beam in accordance with the output of the sensor during a first time interval for monitoring the evaporation rate of the substance on the substrate only during the first time interval in order to control the deposition rate;

(2) maintaining the energy of the electron beam constant during a second time interval, longer than the first time interval; and (3) alternatively repeating steps (1) and (2) to form the electroluminescent layer.

2. The method of claim 1, said sensor including a crystal oscillating element including a crystal on which the substance is deposited and a shutter held open for the first time interval for causing the substance evaporated to be deposited on the crystal, said crystal oscillating element outputting a frequency signal in accordance with the thickness of deposition on the crystal.

3. The method of claim 1, further comprising directing an additional electron beam to an additional pellet of the substance containing the additive agent and vaporizing and depositing the substance of the additional pellet on the substrate.

4. The method of claim 1, further comprising the step of moving a deflecting coil in an area irradiated by the electron beam on the pellet, so that the first time interval is synchronized with a movement of the deflecting coil irradiated by the electron beam.

5. The method of claim 4, wherein the alternating field generated by the deflecting coil causes the electron beam to scan on the surface of the pellet, and the energy per area which the electron beam provides to the pellet is controlled by varying the scanning width of the electron beam.

6. The method of claim 5, wherein the pellet is rotated at a longer cycle than the shortest cycle of the alternating field to irradiate an overall surface of the pellet with the electron beam.

7. The method of claim 5, wherein the scanning width is varied as the deposition proceeds so that the concentration of the additive agent of the deposited film is varied.

* * * * *